(12) United States Patent
Tanaka et al.

(10) Patent No.: US 10,279,552 B2
(45) Date of Patent: May 7, 2019

(54) MANUFACTURING METHOD OF LIGHT EMITTING DEVICE

(71) Applicant: TOYODA GOSEI CO., LTD., Kiyosu-shi (JP)

(72) Inventors: Motoyuki Tanaka, Kiyosu (JP); Yosuke Tsuchiya, Kiyosu (JP); Hiroyuki Tajima, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 315 days.

(21) Appl. No.: 15/271,086

(22) Filed: Sep. 20, 2016

(65) Prior Publication Data

US 2017/0087751 A1  Mar. 30, 2017

(30) Foreign Application Priority Data

Sep. 29, 2015  (JP) .................................. 2015-191679

(51) Int. Cl.
| | |
|---|---|
| *B29D 11/00* | (2006.01) |
| *B29C 45/00* | (2006.01) |
| *H01L 21/56* | (2006.01) |
| *H01L 33/56* | (2010.01) |
| *B29C 45/14* | (2006.01) |
| *B29C 45/26* | (2006.01) |

(52) U.S. Cl.
CPC .... *B29D 11/0074* (2013.01); *B29C 45/14655* (2013.01); *B29C 45/2606* (2013.01); *H01L 21/56* (2013.01); *H01L 33/56* (2013.01)

(58) Field of Classification Search
CPC .......... B29D 11/0074; B29C 45/14655; B29C 45/2606; H01L 21/56; H01L 33/56
See application file for complete search history.

(56) References Cited

U.S. PATENT DOCUMENTS

| | | |
|---|---|---|
| 2006/0101757 A1 | 5/2006 | Tsuzuki et al. |
| 2009/0309122 A1 | 12/2009 | Kim et al. |

FOREIGN PATENT DOCUMENTS

| | | |
|---|---|---|
| EP | 2082858 | * 7/2009 |
| JP | 2003-168824 A | 6/2003 |

(Continued)

OTHER PUBLICATIONS

Japanese Office Action, dated Sep. 25, 2018, in Japanese Application No. 2015-191679 and English Translation thereof.

*Primary Examiner* — Mathieu D Vargot
(74) *Attorney, Agent, or Firm* — McGinn I. P. Law Group, PLLC

(57) ABSTRACT

A manufacturing method of a side view type light emitting device including a package body made of a synthetic resin material, the manufacturing method includes: providing an injection molding mold, for injection-molding the package body, including: a first mold provided with a first convex part for forming an upper surface side flat part on an upper surface of the package body; and a second mold provided with a first concave part for forming the upper surface side flat part; and fitting the first concave part around the first convex part so as to enter a liquid tight state with no space, injecting the synthetic resin material into each of the first and second molds so as to be filled therein, and hardening the synthetic resin material to form the package body in a state in which the first mold and the second mold are aligned with each other.

20 Claims, 17 Drawing Sheets

(56) References Cited

FOREIGN PATENT DOCUMENTS

| | | |
|---|---|---|
| JP | 2004-363503 A | 12/2004 |
| JP | 2006-054410 A | 2/2006 |
| JP | 2006-108333 A | 4/2006 |
| JP | 2007-027800 A | 2/2007 |
| JP | 2007-027801 A | 2/2007 |
| JP | 2009-177093 A | 8/2009 |
| JP | 2009-302527 A | 12/2009 |

* cited by examiner

MANUFACTURING METHOD OF LIGHT EMITTING DEVICE

CROSS-REFERENCE TO RELATED APPLICATION(S)

This application is based upon and claims the benefit of priority from Japanese Patent Application No. 2015-191679, filed on Sep. 29, 2015, the entire contents of which are incorporated herein by reference.

BACKGROUND

1. Field of the Invention

The present invention relates to a manufacturing method of a light emitting device, and more particularly, to a manufacturing method of a side view type light emitting device.

2. Description of the Related Art

In JP-A-2009-177093, JP-A-2009-302527, JP-A-2007-027801. JP-A-2007-027800, JP-A-2006-108333, JP-A-2006-054410 and JP-A-2004-363503, there are disclosed side view type light emitting devices (edge type light emitting devices).

JP-A-2009-177093 discloses that, in order to facilitate die-cutting at the time of injection molding of a package body of the light emitting device, the package body includes a box-shaped block part of a front side and an inclined block part of a back side, an upper surface and a lower surface of the box-shaped block part are approximately in parallel with each other and an upper surface and a lower surface of the inclined block part form tapered surfaces inclined to be narrowed toward the back side.

JP-A-2009-177093 discloses that an injection molding mold for injection-molding the package body includes a fixed mold member and a movable mold member, the fixed mold member forms the inclined block part, and the movable mold member forms the box-shaped block part.

Moreover, JP-A-2009-177093 discloses that a protrusion part s formed at a lower side of the inclined block part so as to be linked with the back, and serves as a support when the package body is placed, so that the slope of the package body is suppressed.

As illustrated in FIG. 17, a package body 101 of a side view type light emitting device 100 in the related art includes a box-shaped block part 102 on a front side and an inclined block part 103 on a back side, an upper surface and a lower surface of the box-shaped block part 102 are approximately in parallel with each other and an upper surface and a lower surface of the inclined block part 103 respectively form tapered surfaces 103a and 103b inclined to be narrowed toward the back side.

At a boundary line between the box-shaped block part 102 and the inclined block part 103, a stepped portion SP is formed such that the box-shaped block part 102 is slightly larger than the inclined block part 103.

The stepped portion SP is provided in order to absorb an alignment error between a fixed mold member and a movable mold member of the injection molding mold for injection-molding the package body 101.

From both side surfaces of the inclined block part 103, terminal parts 104 of lead frames, which are external connection terminals of the light emitting device 100, protrude.

As illustrated in FIG. 18A, since the upper surface of the inclined block part 103 is the tapered surface 103a and the stepped portion SP is formed at each of the parts 102 and 103, when the upper surface side of the package body 101 of the light emitting device 100 is sucked and conveyed by a suction collet BC, the suction collet BC may suck the upper surface side in the state of covering the stepped portion SP by a variation of the suction position.

Then, since the suction force of the suction collet BC is not reliably applied to the package body 101 and the package body 101 becomes unstable, there is a problem that the package body 101 is easily detached from the suction collet BC.

As illustrated in FIG. 18B, there is a problem that the package body 101 is conveyed in an inclined state and is placed on a wiring board MS, and the terminal part 104 of the lead frame is surface-mounted on the wiring board MS by solder SD in the state in which the package body 101 has been inclined.

When the package body 101 is surface-mounted on the wiring board MS in the inclined state, since a light emitting direction a from the front side of the light emitting device 100 is also inclined downward, it is not possible to allow the light emitting direction a to be a direction being parallel with the wiring board MS, which is a correct direction.

For example, when the light emitting device 100 is used as a back light of a liquid crystal display, if the light emitting direction a for a liquid crystal panel is not correct, it causes color irregularity in the liquid crystal panel.

When the stepped portion SP is not provided at the parts 102 and 103 of the package body 101, if positional shift occurs in the boundary line of the parts 102 and 103 by the alignment error of the injection molding mold, the inclined block part 103 protrudes from the box-shaped block part 102 and an external dimension of the package body 101 is not within a standard, resulting in a problem that yield is reduced.

Furthermore, when the upper surface and the lower surface of the inclined block part 103 are not allowed to form the tapered surfaces 103a and 103b and are allowed to be approximately parallel with each other similarly to the box-shaped block part 102, the release property (the easiness of die-cutting) of the fixed mold member is deteriorated, resulting in a problem that productivity is reduced.

Accordingly, providing the stepped portion SP at the parts 102 and 103 of the package body 101 and allowing the upper surface and the lower surface of the inclined block part 103 to form the tapered surfaces 103a and 103b are essential to the side view type light emitting device 100 because the yield and the productivity are not impaired.

Although not disclosed in the specification of JP-A-2009-302527, drawings illustrate a stepped portion corresponding to the stepped portion SP.

In JP-A-2007-027801, JP-A-2007-027800, JP-A-2006-108333, JP-A-2006-054410, and JP-A-2004-363503, there are not disclosed configurations corresponding to the stepped portion SP and the tapered surfaces 103a and 103h. However, as described above, since the stepped portion SP and the tapered surfaces 103a and 103b are essential, when the technologies disclosed in JP-A-2007-027801. JP-A-2007-027800, JP-A-2006-108333, JP-A-2006-054410, and JR-A-2004-363503 are actually used for developing a product, configurations corresponding to the stepped portion SP and the tapered surfaces 103a and 103b need to be essentially provided.

Accordingly, also in JP-A-2009-177093, JP-A-2009-302527, JP-A-2007-027801, JP-A-2007-027800, JP-A-2006-108333, JP-A-2006-054410, and JP-A-2004-363503, the aforementioned problems occur.

SUMMARY

An object of the present invention is to provide a manufacturing method of a light emitting device, by which, when a package body is sucked and conveyed by a suction collet, it is possible to prevent the package body from being detached from the suction collet and to prevent the package body from being surface-mounted on a wiring board in an inclined state without impairing yield and productivity.

As a result of intensive study for solving the aforementioned problems, the present inventors have reached each aspect of the present invention.

According to a first aspect of the present invention, there is provided a manufacturing method of a side view type light emitting device, the side view type light emitting device including a package body made of a synthetic resin material, the manufacturing method including: providing an injection molding mold for injection-molding the package body, the injection molding mold including: a first mold provided with a first convex part for forming an upper surface side flat part on an upper surface of the package body; and a second mold provided with a first concave part for forming the upper surface side flat part; and fitting the first concave part around the first convex part so as to enter a liquid tight state with no space, injecting the synthetic resin material into each of the first and second molds so as to be filled therein, and hardening the synthetic resin material to form the package body in a state in which the first mold and the second mold are aligned with each other.

As described above, providing the stepped portion at a part corresponding to coupling between the first mold and the second mold in the package body and allowing an upper surface of a part corresponding to one mold in the package body to form a tapered surface are essential to the side view type light emitting device because yield and productivity are not impaired.

In the first aspect, although the stepped portion and the tapered surface have been provided, since the upper surface side flat part is formed in the package body, when the package body is sucked and conveyed by a suction collet, it is sufficient if the upper surface side flat part is sucked by the suction collet.

Then, the suction force of the suction collet is reliably applied to the package body and the package body becomes stable, so that it is possible to prevent the package body from being detached from the suction collet.

Furthermore, since the package body is not conveyed in an inclined state and is not placed on the wiring board, the package body can be prevented from being surface-mounted on the wiring board in the inclined state.

A second aspect of the present invent ion provides the manufacturing method of the light emitting device according to the first aspect, wherein: the first mold is provided with a second convex part for forming a lower surface side flat part on a lower surface of the package body; the second mold is provided with a second concave part for forming the lower surface side flat part; and the second concave part is fitted around the second convex part so as to enter a liquid tight state with no space in a state in which the first mold and the second mold are aligned with each other.

In the second aspect, since the lower surface side flat part is formed in the package body, when the package body has been surface-mounted on the wiring board, the lower surface side flat part abuts the wiring board and serves as a support when the package body is placed, so that it is possible to more reliably prevent the package body from being surface-mounted on the wiring board in an inclined state.

A third aspect of the present invent ion provides the manufacturing method of the light emitting device according to the first aspect or the second aspect, wherein: the convex part and the concave part have a trapezoidal shape according to shape dimensions of the flat parts when viewed in a plan view and both sides of the convex part and the concave part have a tapered shape such that widths of both sides are narrowed toward a front end side of each of the convex part and the concave part.

In the third aspect, it is possible to improve the release property when the first mold and the second mold are released from the package body, resulting in an increase in productivity.

A fourth aspect of the present invention provides the manufacturing method of the light emitting device according to any one of the first, second and third aspects, wherein: a depth of the concave part is smaller than a height of the mold provided with the concave part.

In the fourth aspect, the height (the depth) of the convex part fitted into the concave part is equal to the depth of the concave part. Therefore, since the height of the convex part is low, the convex part can be easily formed and the strength of the convex part can be easily ensured, so that it is possible to simply manufacture the injection molding mold.

A fifth aspect of the present invention provides the manufacturing method of the light emitting device according to any one of the first, second, third and fourth aspects, wherein the flat part is arranged to be formed at a center part in a longitudinal direction of the package body.

In the fifth aspect, when the upper surface side flat part is sucked and conveyed by a suction collet BC, it is possible to increase the stability of the package body and to reliably obtain the operation effect of the first aspect.

In the fifth aspect, when the package body has been surface-mounted on a wiring board MS, the package body can be placed on the wiring board MS in a stable state, so that it is possible to reliably obtain the operation effect of the second aspect.

A sixth aspect of the present invention provides the manufacturing method of the light emitting device according to any one of the first, second, third, fourth and fifth aspects, wherein the flat part includes a plurality of parts, and the plurality of parts are arranged to be line symmetric with respect to a center line in a longitudinal direction of the package body.

In the sixth aspect, even though the package body is long, since a plurality of upper surface side flat parts are respectively sucked by separate suction collets, it is possible to reliably apply the suction force of the suction collet to the package body, so that it is possible to reliably obtain the operation-effect of the first aspect.

In the sixth aspect, even though the package body is long, when the package body has been surface-mounted on a wiring board, a plurality of lower surface side flat parts abut the wiring board and the package body can be placed on the wiring board in a stable state, so that it is possible to reliably obtain the operation-effect of the second aspect.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Figure 1A:
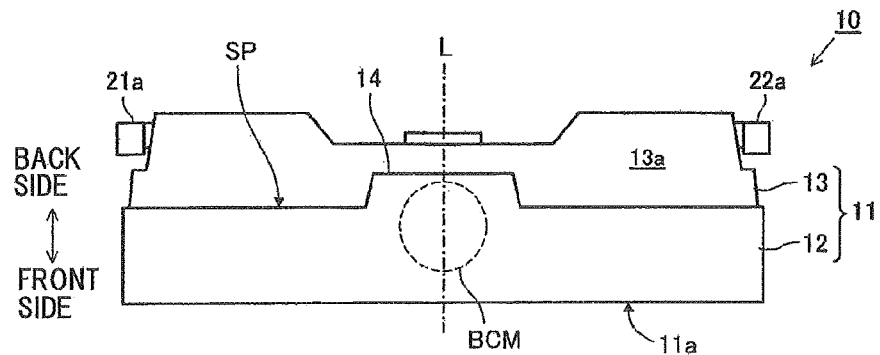
FIG. 1A is a top view of a light emitting device 10 of a first embodiment obtained by embodying the present invention.

Hereinafter, each embodiment obtained by embodying the present invention will be described with reference to drawings. In each embodiment, the same reference numerals are used to designate the same constituent members and elements and a description thereof will be omitted in order to avoid redundancy.

In each drawing, in order to facilitate a description, the shape dimensions and arrangement places of the constituent. Members of each embodiment are exaggerated and schematically illustrated, and the shape dimensions and arrangement places of the constituent members do not always coincide with the real things.

First Embodiment

Figure 1B:
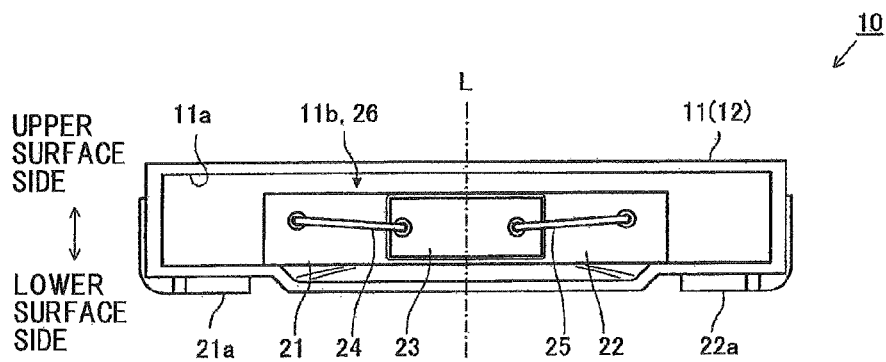
FIG. 1B is a front view of the light emitting device 10.
Figure 1C:
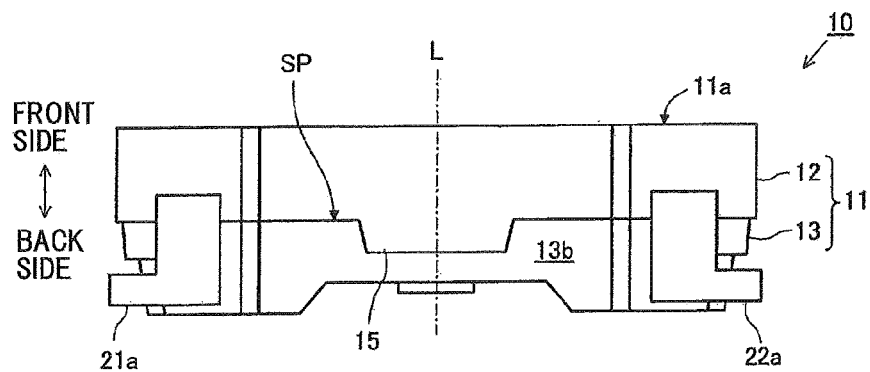
FIG. 1C is a bottom view of the light emitting device 10.
Figure 2:
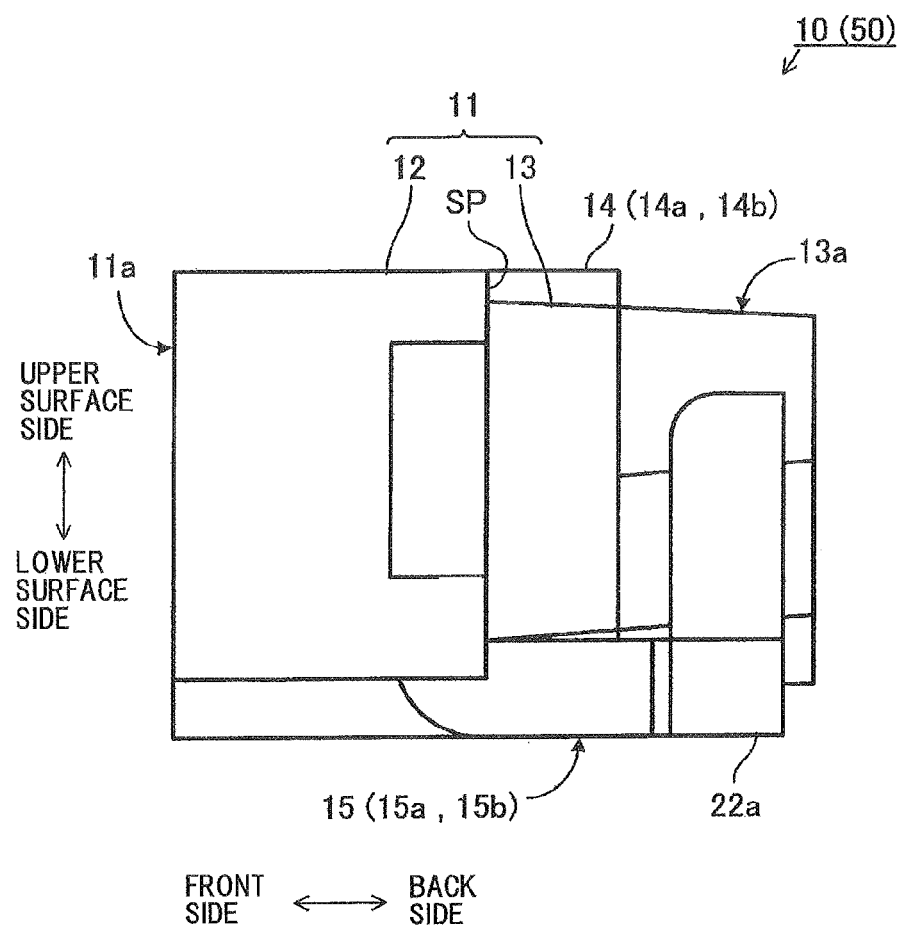
FIG. 2 is a right side view of the light emitting device 10 and a light emitting device 50 of a second embodiment obtained by embodying the present invention.

As illustrated in FIGS. 1A to 2, a light emitting device 10 of a first embodiment is a side view type light emitting device (an edge type light emitting device) that includes a package body 11 (an opening 11a and a receiving concave part 11b), a box-shaped block part 12, an inclined block part 13 of a back side, an upper surface side tapered surface 13a, a lower surface side tapered surface 13b, a stepped portion SP, an upper surface side flat part 14, a lower surface side flat part 15, lead frames 21 and 22 (terminal parts 21a and 22a), an LED (Light Emitting Diode) chip 23, bonding wires 24 and 25, a sealing resin 26 and the like, and emits light in a side direction.

The light emitting device 10 has a horizontal flat shape, and constituent members are line-symmetrically formed to face one another with respect to a center line (a reference line) L that divides a longitudinal direction into two.

The package (case) body 11 has a horizontal flat box shape and is integrally formed by injection molding of a synthetic resin material, a front surface (a side surface) of the package body 11 serves as the entirely opened light emitting opening 11a and space of the opening 11a serves as the receiving concave part 11b.

The receiving concave part 11b of the package body 11 receives the lead frames 21 and 22, the LED chip 23, and the bonding wires 24 and 25.

The package body 11 includes the box-shaped block part 12 on a front side and the inclined block part 13 on a back side.

An upper surface and a lower surface of the box-shaped block part 12 are approximately in parallel with each other.

An upper surface and a lower surface of the inclined block part 13 are respectively provided with the upper surface side tapered surface 13a and the lower surface side tapered surface 13b, and the upper surface side flat part 14 and the lower surface side flat part 15.

Each of the tapered surfaces 13a and 13b is inclined toward the hack side of the light emitting device 10 such that its width in the vertical direction is narrowed.

Each of the flat parts 14 and 15 has a trapezoidal shape when viewed in a plan view, the upper surface side flat part 14 is formed to be continuously level with the upper surface of the box-shaped block part 12 with no step difference, and the lower surface side flat part 15 is formed to be continuously level with the lower surface of the box-shaped block part 12 with no step difference.

Each of the flat parts 14 and 15 is arranged at a center part in the longitudinal direction of the package body 11, and is line symmetric with respect to the center line L.

Also between a front end portion of each of the flat parts 14 and 15 and the back side of the inclined block part 13, each of the tapered surfaces 13a and 13b is formed.

At the boundary line between the box-shaped block part 12 and each of the tapered surfaces 13a and 13b of the inclined block part 13, the stepped portion SP is formed such that the box-shaped block part 12 is slightly larger than the inclined block part 13.

The lead frames 21 and 22 are formed by press working of a metal plate, are insert-molded at the time of injection molding of the package body 11 so as to be buried in the package body 11, and are juxtaposed in the longitudinal direction of the package body 11.

The surfaces of the lead frames 21 and 22 are shown (exposed) from the bottom surface of the receiving concave part 11b.

The lead frames 21 and 22 are provided with the terminal parts 21a and 22a extending from the surfaces of the lead frames 21 and 22 shown from the bottom surface of the receiving concave part 11h.

The terminal parts 21a and 22a of the lead frames 21 and 22 are drawn out to an exterior from the lower surface side of the package body 11 so as to be bent to a lateral side, and constitute external connection terminals of the light emitting device 10.

On the surface of the lead frame 22, the LED chip 23 is placed and fixed so as to be mounted (implemented).

The LED chip 23 has a flat approximately rectangular parallelepiped shape, and is provided on an upper surface thereof with a plus-side electrode (not illustrated) and a minus-side electrode (not illustrated), and the electrodes are connected to the lead frames 21 and 22 via the bonding wires 24 and 25.

The receiving concave part 11b of the package body 11 is filled with transparent sealing resin 26, and the stored objects (the lead frames 21 and 22, the LED chip 23, and the bonding wires 24 and 25) in the receiving concave part 11b are sealed by the sealing resin 26.

[Manufacturing Method of Light Emitting Device 10]

Figure 3A:
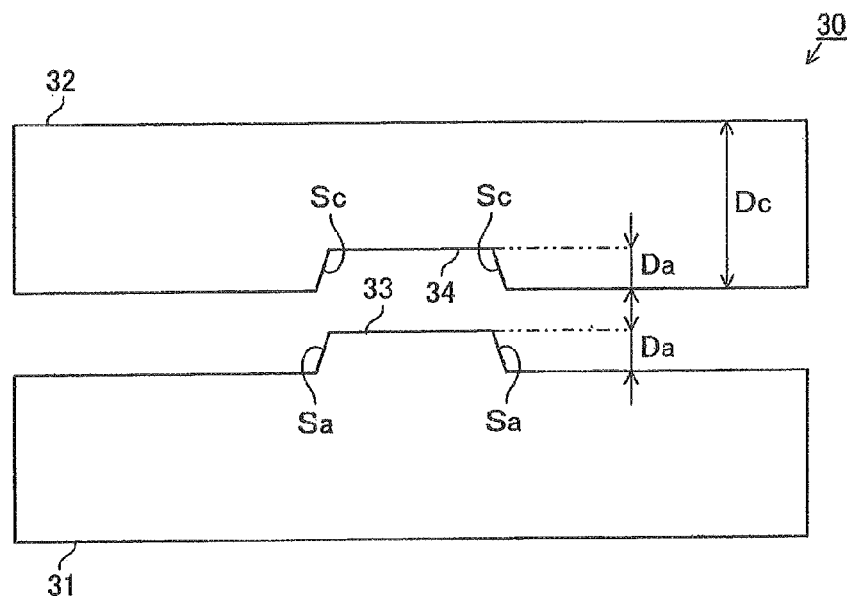
FIG. 3A is a front view of an injection molding mold 30 for injection-molding a package body 11 of the light emitting device 10 and FIG. 3B is a rear view of the injection molding mold 30.
Figure 3B:
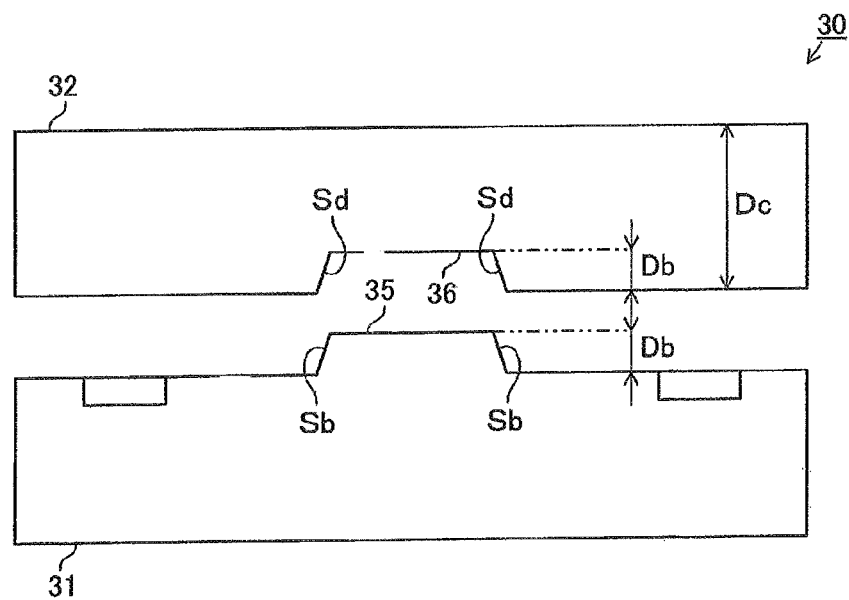
Figure 4A:
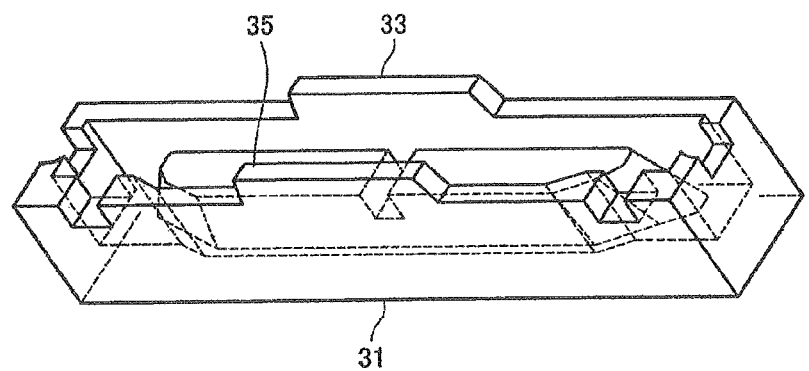
FIGS. 4A and 4B are perspective vie for explaining a manufacturing method of the light emitting device 10.
Figure 4B:
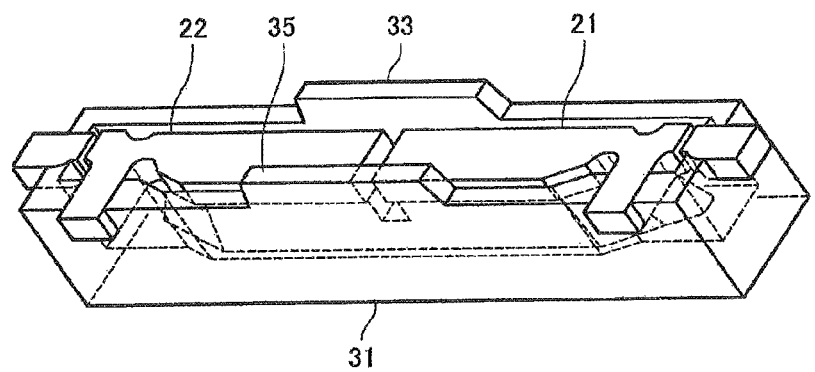

As illustrated in FIGS. 3A and 3B, an injection molding mold 30 for injection-molding the package body 11 of the light emitting device 10 includes a movable mold (a lower mold) 31 and a fixed mold (an upper mold) 32, and the movable mold 31 forms the box-shaped block part 12 and the fixed mold 32 forms the inclined block part 13.

As illustrated in FIG. 3A, the movable mold 31 is provided at a front side thereof with a first convex part 33 for forming the upper surface side flat part 14, and the fixed mold 32 is provided at a front side thereof with a first concave part 34 for forming the upper surface side flat part 14.

As illustrated in FIG. 3B, the movable mold 31 is provided at a back side thereof with a second convex part 35 for forming the lower surface side flat part 15, and the fixed mold 32 is provided at a back side thereof with a second concave part 36 for forming the lower surface side flat part 15.

Each of the convex parts 33 and 35 of the movable mold 31 has a trapezoidal shape when viewed in a plan view according to a shape dimension of each of the flat parts 14 and 15 of the package body 11, and both sides Sa and Sb of each of the convex parts 33 and 35 have a tapered shape such that each of both sides Sa and Sb is formed to be narrowed toward the front end side of each of the convex parts 33 and 35.

Each of the concave parts 34 and 36 of the fixed mold 32 has a trapezoidal shape when viewed in a plan view according to the shape dimension of each of the flat parts 14 and 15 of the package body 11, and both sides Sc and Sd of each of the concave parts 34 and 36 have a tapered shape such that each of both sides Sc and Sd is formed to be narrowed toward the front end side of each of the concave parts 34 and 36.

Next, a manufacturing process of the package body 11 of the light emitting device 10 will be described.

Step 1 (see FIG. 3A to FIG. 4A): The movable mold 31 is prepared.

Step 2 (see FIG. 4B): Each of the lead frames 21 and 22 is set in the movable mold 31.

Figure 5A:
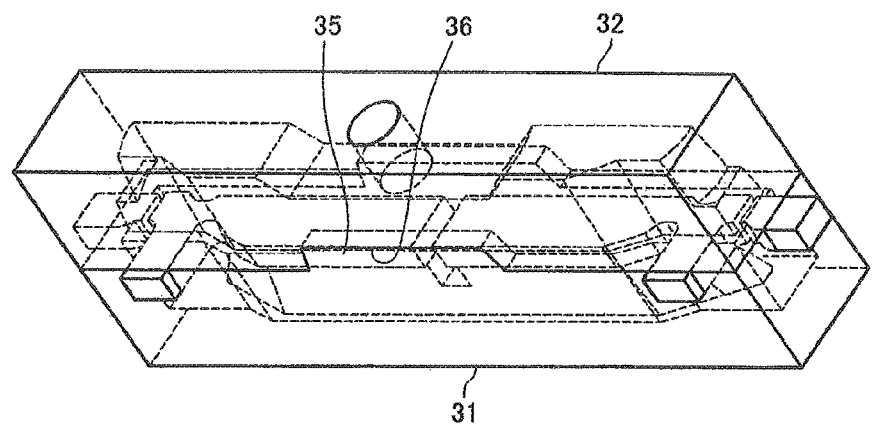
FIGS. 5A and 5B are perspective views for explaining a manufacturing method of the light emitting device 10.

Step 3 (see FIGS. 3A and 3B and FIG. 5A): The fixed mold 32 is prepared and the movable mold 31 is set by aligning from a lower portion of the fixed mold 32.

In the state in which the movable mold 31 and the fixed mold 32 have been aligned with each other, the movable mold 31 is fitted into the fixed mold 32 such that the concave parts 34 and 36 respectively enter a liquid tight state with no space with respect to the convex parts 33 and 35.

Step 4 (see FIG. 5B and FIG. 7A): A synthetic resin material (a resin composition) PM is injected into each of the molds 31 and 32 so as to be filled therein, and is hardened, so that the package body 11 is formed.

It is sufficient if thermoplastic resin or thermosetting resin is used as the synthetic resin material PM.

The thermoplastic resin, for example, includes polyimide resin, LCP (Liquid Crystal Polymer) resin, PPS (Poly Phenylene Sulfide Resin) resin and the like.

The thermosetting resin, for example, includes silicone resin, modified silicone resin, epoxy resin, modified epoxy resin and the like.

Figure 5B:
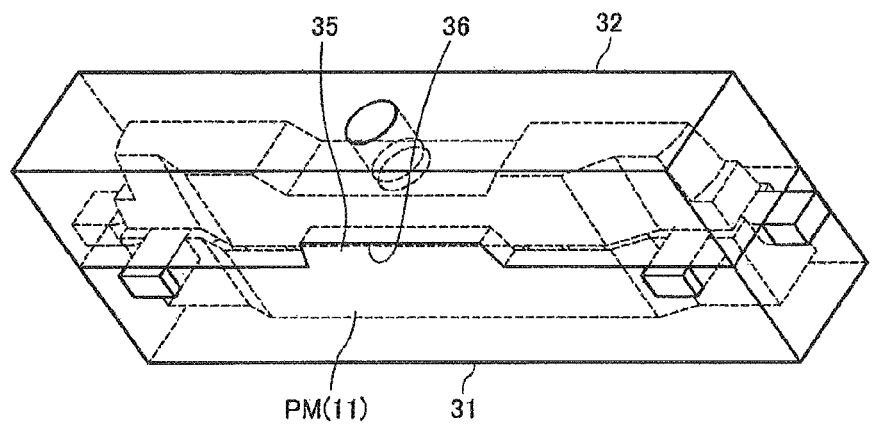
Figure 7A:
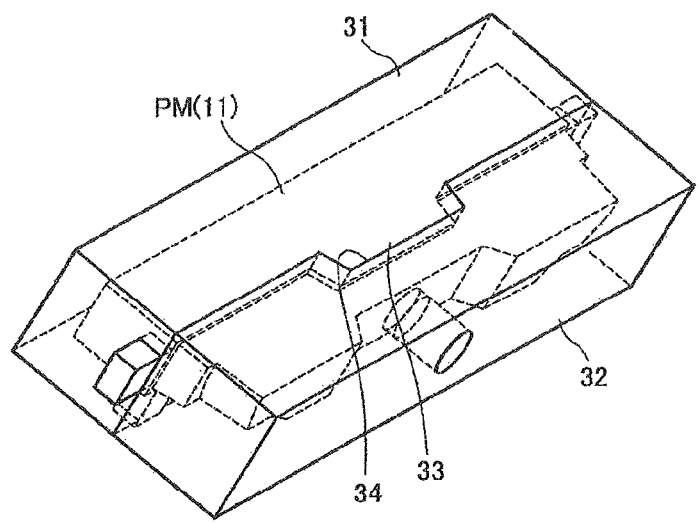
FIGS. 7A and 7B are perspective views for explaining a manufacturing method of the light emitting device 10.

FIG. 7A is a perspective view when viewed from a different direction with respect to FIG. 5B.

Step 5 (see FIG. 6A and FIG. 7B): The movable mold 31 is detached from the fixed mold 32 and the fixed mold 32 is released from the package body 11.

Figure 6A:
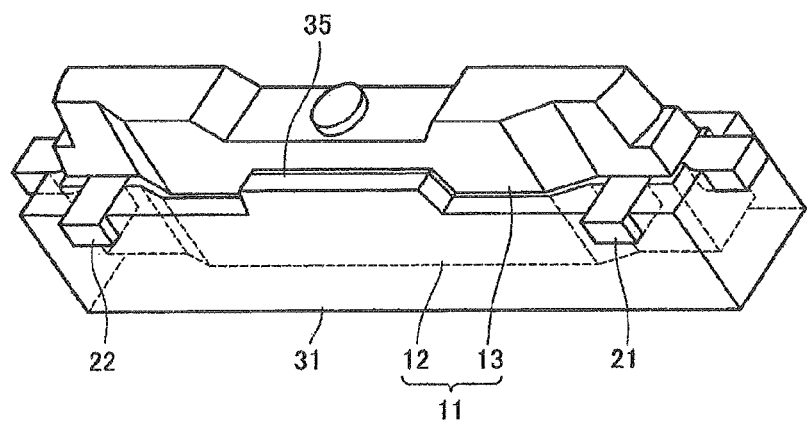
FIGS. 6A and 6B are perspective views for explaining a manufacturing method of the light emitting device 10.
Figure 7B:
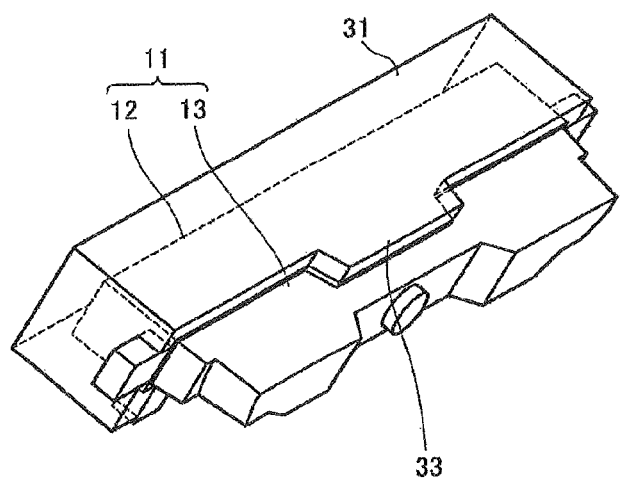

FIG. 7B is a perspective view when viewed from a different direction with respect to FIG. 6A.

Step 6 (see FIG. 6B and FIG. 8): When the movable mold 31 is released from the package body 11, the package body 11, in which the lead frames 21 and 22 have been insert-molded, is completed.

Figure 6B:
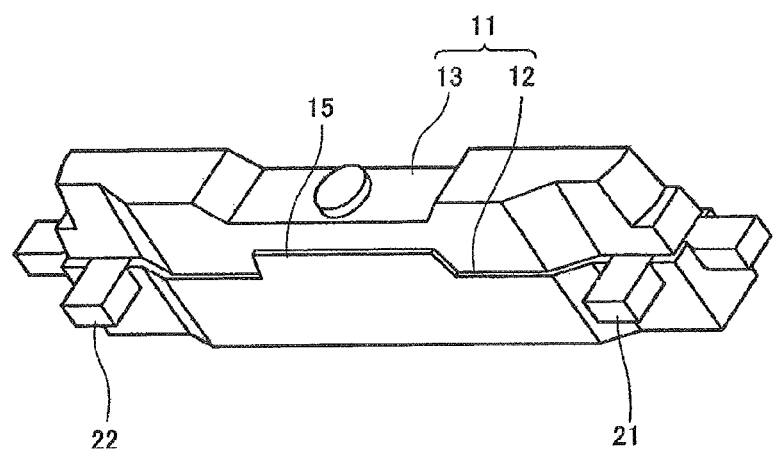
Figure 8:
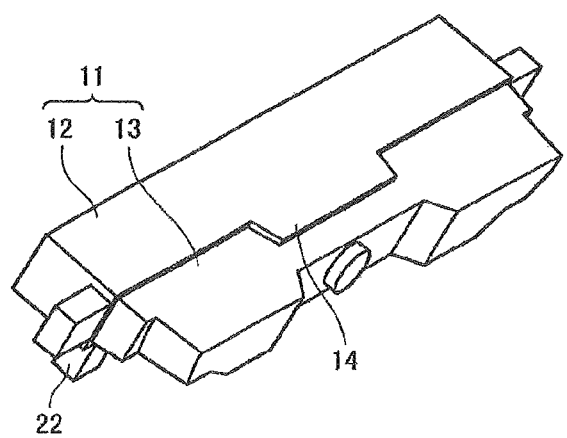
FIG. 8 is a perspective view for explaining a manufacturing method of the light emitting device 10.

FIG. 8 is a perspective view when viewed from a different direction with respect to FIG. 6B.

Thereafter, the lead frames 21 and 22 protruding from the lower surface side of the package body 11 are bent, so that the terminal parts 21a and 22a of the lead frames 21 and 22 illustrated in FIGS. 1A to 2 are formed.

[Operation-Effect of First Embodiment]

According to the manufacturing method of the light emitting device 10 in the first embodiment, the following operation-effect can be obtained.

[1] When the stepped portion SP is not provided at the parts 12 and 13 of the package body 11, if positional shift occurs in the boundary line of the parts 12 and 13 by the alignment error of the injection molding mold 30, the inclined block part 13 protrudes from the box-shaped block part 12 and an external dimension of the package body 11 is not within a standard, resulting in a problem that yield is reduced.

Furthermore, when the upper surface and the lower surface of the inclined block part 13 are not allowed to form the tapered surfaces 13a and 13b and are allowed to be approximately parallel with each other similarly to the box-shaped block part 12, the release property of the fixed mold 32 (the second mold) is deteriorated, resulting in a problem that productivity is reduced.

Accordingly, providing the stepped portion SP at the parts 12 and 13 of the package body 11 and allowing the upper surface and the lower surface of the inclined block part 13 to form the tapered surfaces 13a and 13b are essential to the side view type light emitting device 10 because the yield and the productivity are not impaired.

Figure 9A:
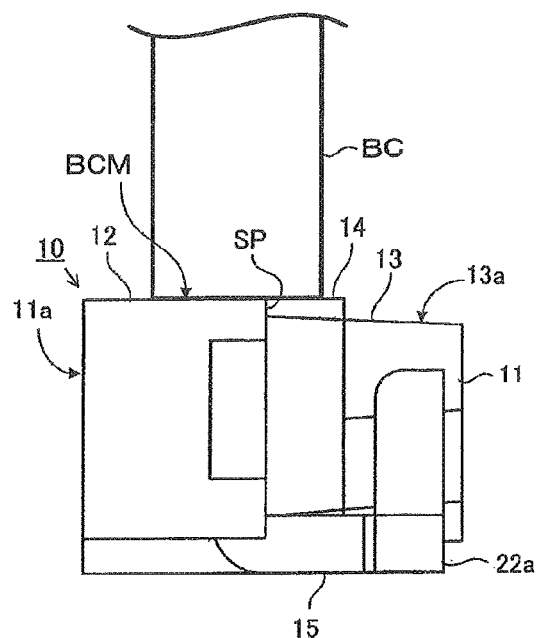
FIGS. 9A and 9B are explanation diagrams for explaining operation-effect of the first embodiment and are right side views of the light emitting device 10.

As illustrated in FIG. 9A, in the light emitting device 10, although the stepped portion SP and the upper surface side tapered surface 13a have been provided, since the upper surface side flat part 14 is formed in the package body 11, when the package body 11 is sucked and conveyed by a suction collet BC, it is sufficient if the upper surface side flat part 14 is sucked by the suction collet BC.

As illustrated in FIG. 1A, it is necessary to set a dimension of the upper surface side flat part 14 to be sufficiently larger than that of a suction port BCM of the suction collet BC.

Then, the suction force of the suction collet BC is reliably applied to the package body 11 and the package body 11 becomes stable, so that it is possible to prevent the package body 11 from being detached from the suction collet BC.

Figure 9B:
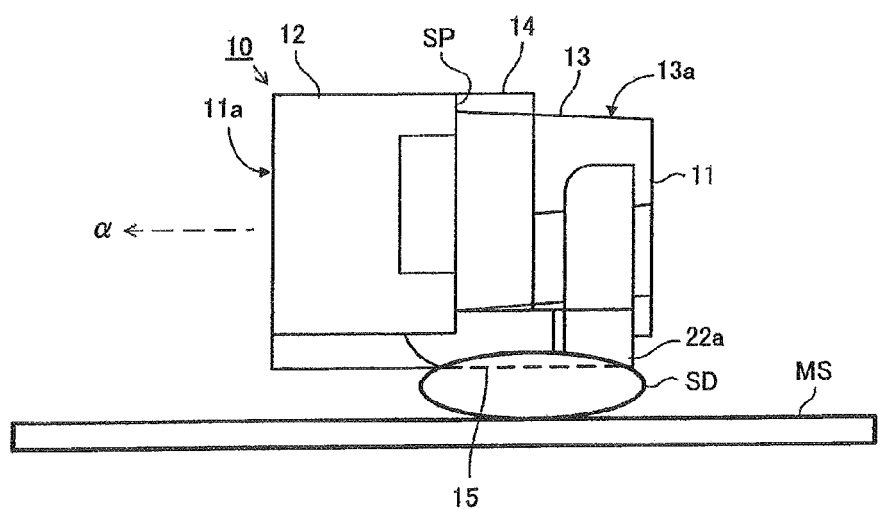
Figure 10A:
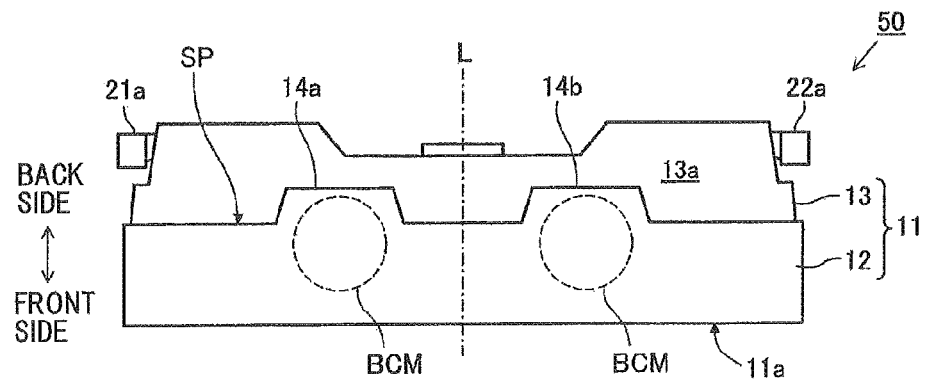
FIG. 10A is a top view of the light emitting device 50.
Figure 10B:
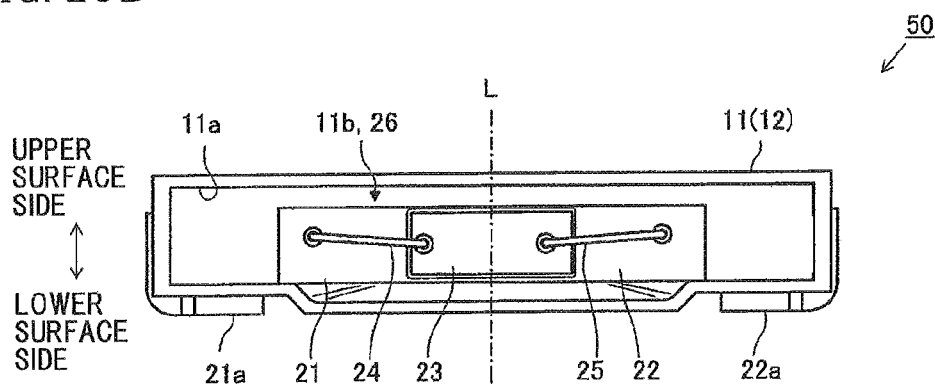
FIG. 10B is a front view of the light emitting device 50.
Figure 10C:
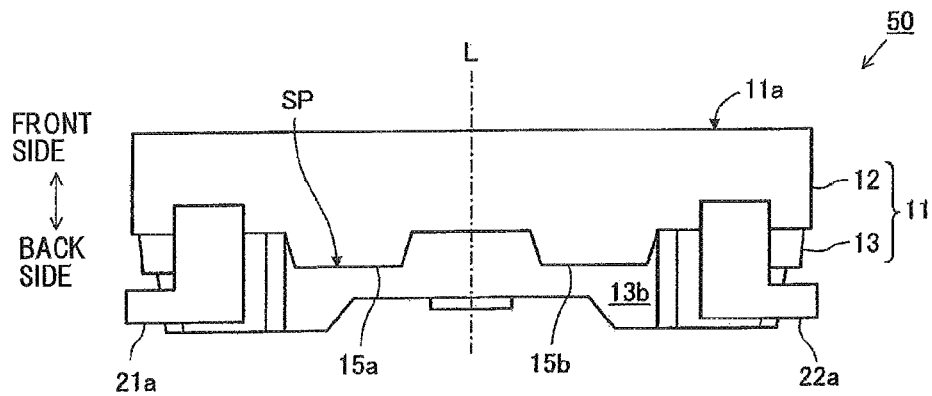
FIG. 10C is a bottom view of the light emitting device 50.

As illustrated in FIG. 9B, since the package body 11 is not conveyed in an inclined state and is not placed on the wiring board MS, the terminal part 22a (21a) of the lead frame can be prevented from being surface-mounted on the wiring board MS by solder SD in the state in which the package body 11 is in the inclined state.

As a consequence, the light irradiation direction ac from the front side of the light emitting device 10 can be allowed to be a direction being parallel with the wiring board MS, which is a correct direction.

Therefore, for example, when the light emitting device 10 is used as a backlight of a liquid crystal display, the light irradiation direction a for a liquid crystal panel becomes correct, so that it is possible to prevent color irregularity from occurring in the liquid crystal panel.

[2] As illustrated in FIG. 9B, since the lower surface side flat part 15 is formed in the package body 11, when the package body 11 has been surface-mounted on the wiring board MS, the lower surface side flat part 15 abuts the wiring board MS and serves as a support when the package body 11 is placed, so that it is possible to more reliably prevent the package body 11 from being surface-mounted on the wiring board MS in an inclined state.

[3] Each of the convex parts 33 and 35 of the movable mold 31 has a trapezoidal shape when viewed in a plan view according to the shape dimension of each of the flat parts 14 and 15 of the package body 11, and both sides Sa and Sb of each of the convex parts 33 and 35 have a tapered shape such that each of both sides Sa and Sb is formed to be narrowed toward the front end side of each of the convex parts 33 and 35.

Each of the concave parts 34 and 36 of the fixed mold 32 has a trapezoidal shape when viewed in a plan view according to the shape dimension of each of the flat parts 14 and 15 of the package body 11, and both sides Sc and Sd of each of the concave parts 34 and 36 have a tapered shape such that each of both sides Sc and Sd is formed to be narrowed toward the front end side of each of the concave parts 34 and 36.

Therefore, it is possible to improve the release property when the movable mold 31 and the fixed mold 32 are released from the package body 11, resulting in an increase in productivity.

[4] As illustrated in FIGS. 3A and 3B, the depths Da and Db of the concave parts 34 and 36 are set to be smaller than the height (the depth) Dc of the fixed mold 32.

The heights (the depths) of the convex parts 33 and 35 fitted into the concave parts 34 and 36 are equal to the depths Da and Db of the concave parts 34 and 36. Therefore, since the heights of the convex parts 33 and 35 are low, the convex parts 33 and 35 can be easily formed and the strength of each of the convex parts 33 and 35 can be easily ensured, so that it is possible to simply manufacture the injection molding mold 30.

The range of the ratios Da/Dc and Db/Dc of the depths Da and Db of the concave parts 34 and 36 with respect to the height (the depth) Dc of the fixed mold 32 is appropriately ⅛ to ¼, and preferably ¼ to ½, more preferably ½.

When the ratios Da/Dc and Db/Dc are larger than the range, since it is difficult to form the convex parts 33 and 35 and it is also difficult to ensure the strength of each of the convex parts 33 and 35, it is difficult to manufacture the injection molding mold 30.

Furthermore, when the ratios Da/Dc and Db/Dc are smaller than the range, since the dimensions of the flat parts 14 and 15 of the package body 11 are also small, it is difficult to obtain the aforementioned operation-effect of [1] and [2].

[5] As illustrated in FIGS. 1A to 1C, each of the flat parts 14 and 15 is arranged at the center part in the longitudinal direction of the package body 11.

Therefore, when the upper surface side flat part 14 is sucked and conveyed by the suction collet BC, it is possible to increase the stability of the package body 11 and to reliably obtain the aforementioned operation-effect of [1].

Furthermore, when the package body 11 has been surface-mounted on the wiring board MS, the package body 11 can be placed on the wiring board MS in a stable state, so that it is possible to reliably obtain the aforementioned operation-effect of [2].

Second Embodiment

As illustrated in FIG. 2 and FIGS. 10A to 10C, a light emitting device 50 of a second embodiment includes the package body 11 (the opening 11a and the receiving concave part 11b), the box-shaped block part 12, the inclined block part 13 of a back side, the upper surface side tapered surface 13a, the lower surface side tapered surface 13b, the stepped portion SP, upper surface side flat parts 14a and 14b, lower surface side flat parts 15a and 15b, the lead frames 21 and 22 (the terminal parts 21a and 22a), the LED chip 23, the bonding wires 24 and 25, the sealing resin 26 and the like.

The light emitting device 50 of the second embodiment is different from the light emitting device 10 of the first embodiment in that the upper surface side flat parts 14a and 14b and the lower surface side flat parts 15a and 15b are respectively provided as a pair.

The upper surface side flat parts 14a and 14b have a trapezoidal shape when viewed in a plan view of the same dimension, and the lower surface side flat parts 15a and 15b have a trapezoidal shape when viewed in a plan view of the same dimension.

The upper surface side flat parts 14a and 14b are formed to be continuously level with the upper surface of the box-shaped block part 12 with no step difference, and the lower surface side flat parts 15a and 15b are formed to be continuously level with the lower surface of the box-shaped block part 12 with no step difference.

Each of the flat parts 14a and 14b is arranged to be line symmetric with respect to the center line L, and each of the flat parts 15a and 15b is arranged to be line symmetric with respect to the center line L.

Also between a front end portion of each of the flat parts 14a, 14b. 15a, and 15b and the back side of the inclined block part 13, each of the tapered surfaces 13a and 13b is formed.

[Manufacturing Method of Light Emitting Device 50]

Figure 11A:
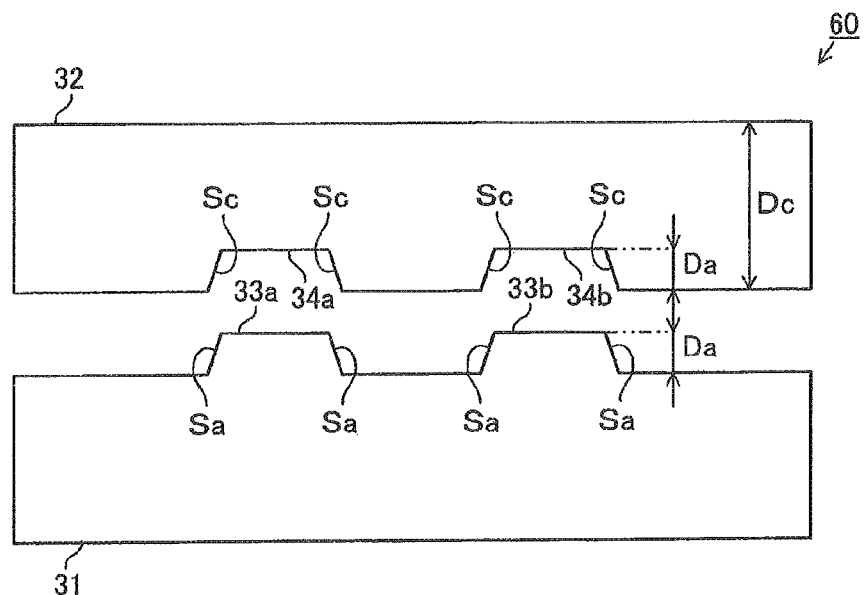
FIG. 11A is a front view of an injection molding mold 60 for injection-molding the package body 11 of the light emitting device 50 and FIG. 11B is a rear view of the injection molding mold 60.
Figure 11B:
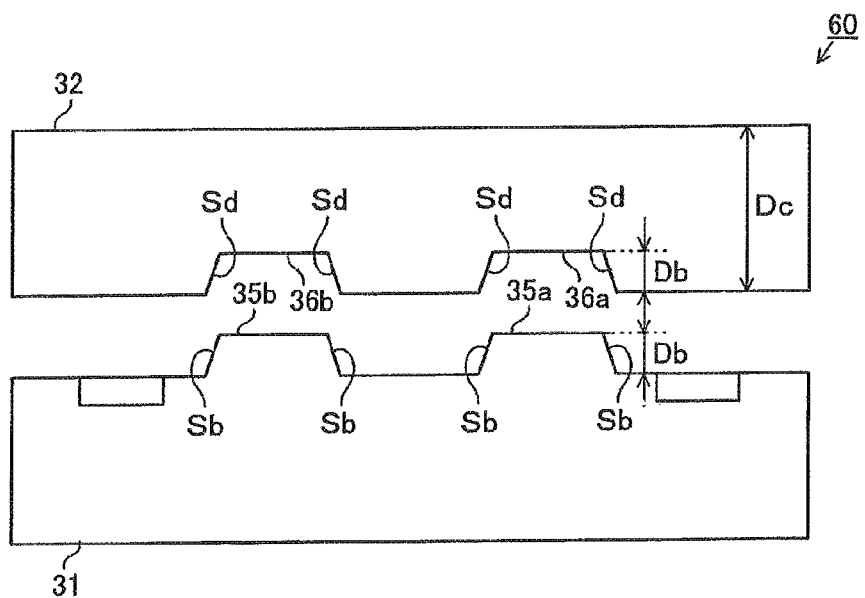
Figure 12A:
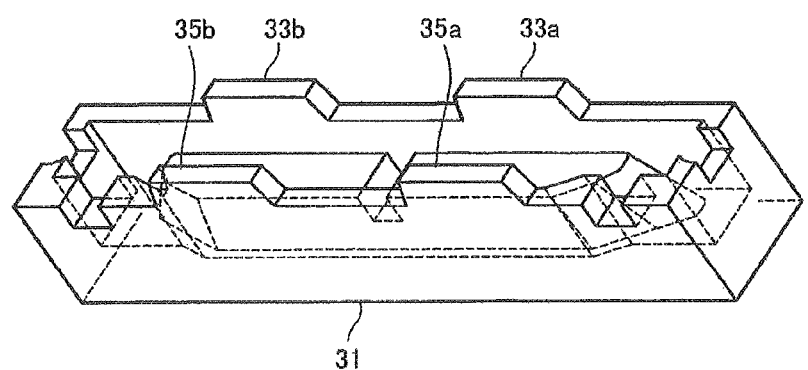
FIGS. 12A and 12B are perspective views for explaining a manufacturing method of the light emitting device 50.
Figure 12B:
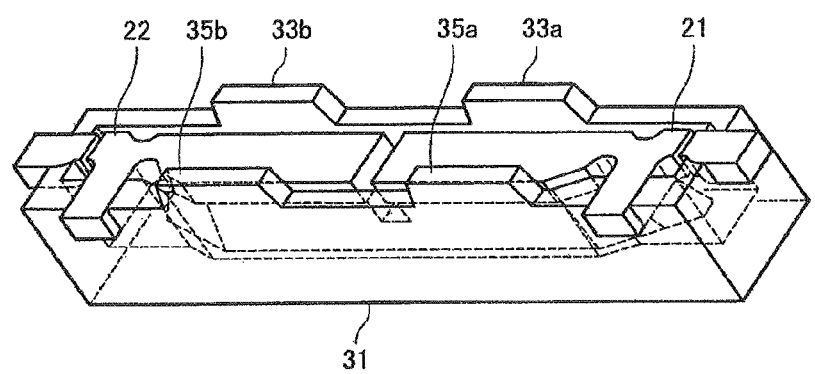

As illustrated in FIGS. 11A and 11B, an injection molding mold 60 for injection-molding the package body 11 of the light emitting device 50 in the second embodiment is different from the injection molding mold 30 of the first embodiment in that first convex parts 33a and 33b, first concave parts 34a and 34b, second convex parts 35a and 35b, second concave parts 36a and 36b are respectively provided as a pair.

As illustrated in FIG. 11A, the movable mold 31 is provided at a front side thereof with the first convex parts 33a and 33b for forming the upper surface side flat parts 14a and 14b, and the fixed mold 32 is provided at a front side thereof with the first concave parts 34a and 34b for forming the upper surface side flat parts 14a and 14b.

As illustrated in FIG. 11B, the movable mold 31 is provided at a back side thereof with the second convex parts 35a and 35b for forming the lower surface side flat parts 15a and 15b, and the fixed mold 32 is provided at a back side thereof with the second concave parts 36a and 36b for forming the lower surface side flat parts 15a and 15b.

Each of the convex parts 33a, 33b, 35a, and 35b of the movable mold 31 has a trapezoidal shape when viewed in a plan view according to a shape dimension of each of the flat parts 14a, 14b, 15a, and 15b of the package body 11, and both sides Sa and Sb of each of the convex parts 33a, 33b, 35a, and 35b have a tapered shape such that each of both sides Sa and Sb is formed to be narrowed toward the front end side of each of the convex parts 33a, 33b, 35a, and 35b.

Each of the concave parts 34a, 34b. 36a, and 36b of the fixed mold 32 has a trapezoidal shape when viewed in a plan view according to the shape dimension of each of the flat parts 14a, 14b, 15a, and 15b of the package body 11, and both sides Sc and Sd of each of the concave parts 34a, 34b, 36a, and 36b have a tapered shape such that each of both sides Sc and Sd is formed to be narrowed toward the front end side of each of the concave parts 34a, 34b. 36a, and 36b.

Next, a manufacturing process of the package body 11 of the light emitting device 50 will be described.

Step 1 (see FIGS. 11A to 12A): The movable mold 31 is prepared.

Step 2 (see FIG. 12B): Each of the lead frames 21 and 22 is set in the movable mold 31.

Figure 13A:
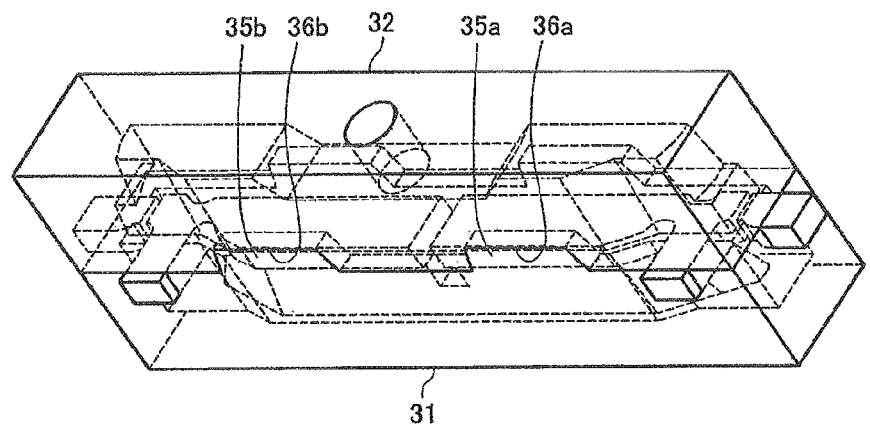
FIGS. 13A and 13B are perspective views for explaining a manufacturing method of the light emitting device 50.

Step 3 (see FIGS. 11A and 11B and FIG. 13A): The fixed mold 32 is prepared and the movable mold 31 is set by aligning the movable mold 31 from a lower portion of the fixed mold 32.

In the state in which the movable mold 31 and the fixed mold 32 have been aligned with each other, the movable mold 31 is fitted into the fixed mold 32 such that the concave parts 34a, 34b, 36a, and 36b respectively enter a liquid tight state with no space with respect to the convex parts 33a, 33b, 35a, and 35b.

Step 4 (see FIG. 13B and FIG. 15A): The synthetic resin material PM is injected into each of the molds 31 and 32 so as to be filled therein, and is hardened, so that the package body 11 is formed.

Figure 13B:
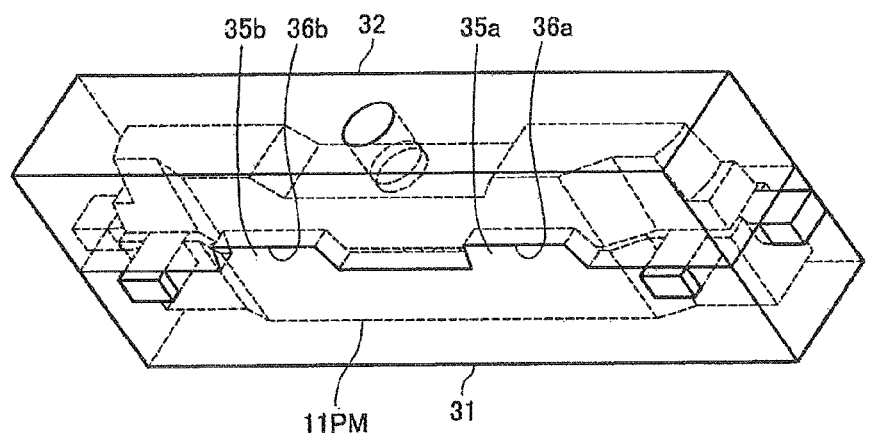
Figure 15A:
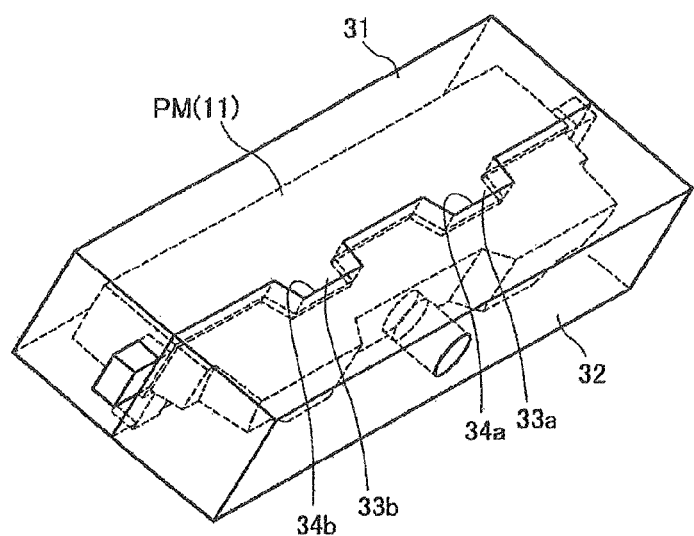
FIGS. 15A and 15B are perspective views for explaining a manufacturing method of the light emitting device 50.

FIG. 15A is a perspective view when viewed from a different direction with respect to FIG. 13B.

Step 5 (see FIG. 14A and FIG. 15B): The movable mold 31 is detached from the fixed mold 32 and the fixed mold 32 is released from the package body 11.

Figure 14A:
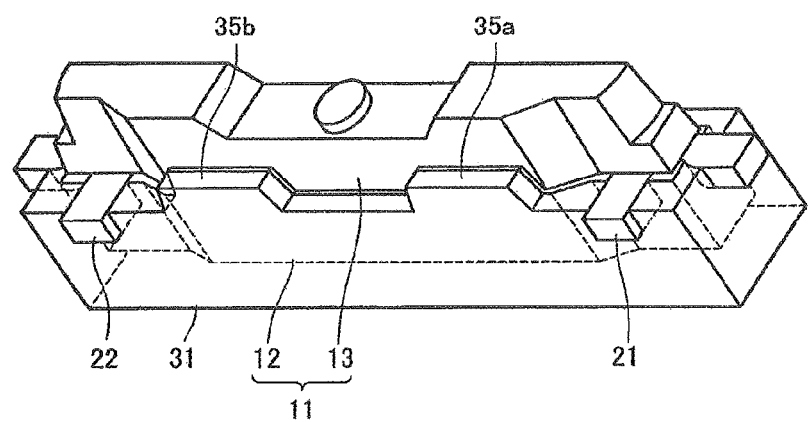
FIGS. 14A and 14B are perspective views for explaining a manufacturing method of the light emitting device 50.
Figure 15B:
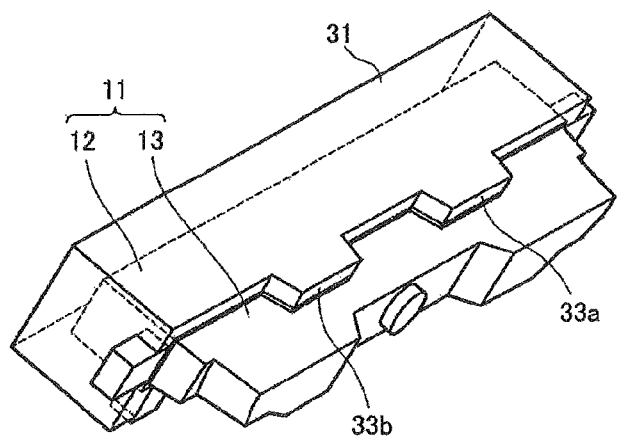

FIG. 15B is a perspective view when viewed from a different direction with respect to FIG. 14A.

Step 6 (see FIG. 14B and FIG. 16): When the movable mold 31 is released from the package body 11, the package body 11, in which the lead frames 21 and 22 have been insert-molded, is completed.

Figure 14B:
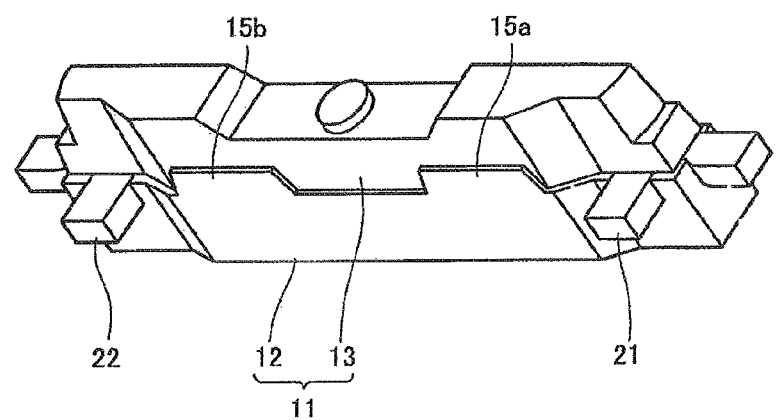
Figure 16:
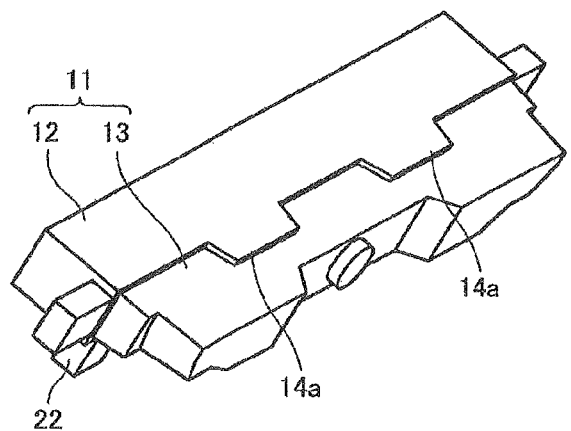
FIG. 16 is a perspective view for explaining a manufacturing method of the light emitting device 50.
Figure 17:
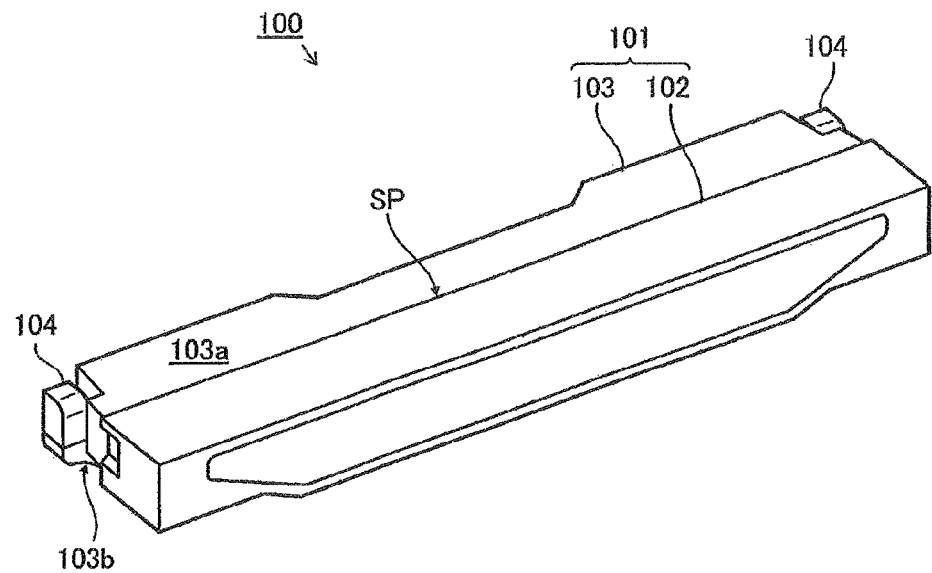
FIG. 17 is a perspective view of a light emitting device 100 of the related art.
Figure 18A:
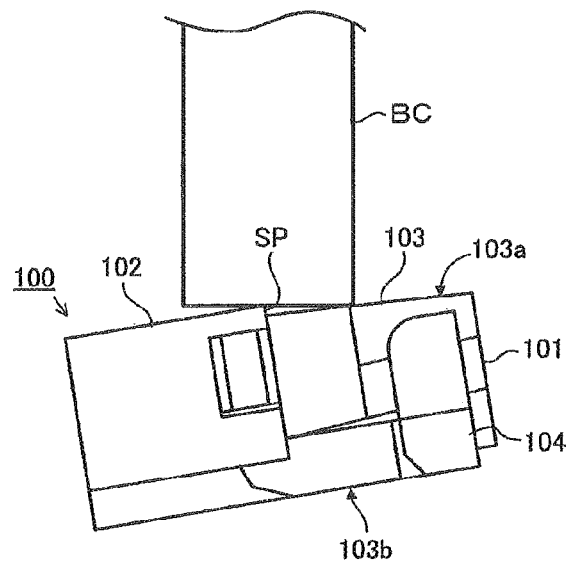
FIGS. 18A and 18B are explanation diagrams for explaining problems of the related art and are right side views of the light emitting device 100.
Figure 18B:
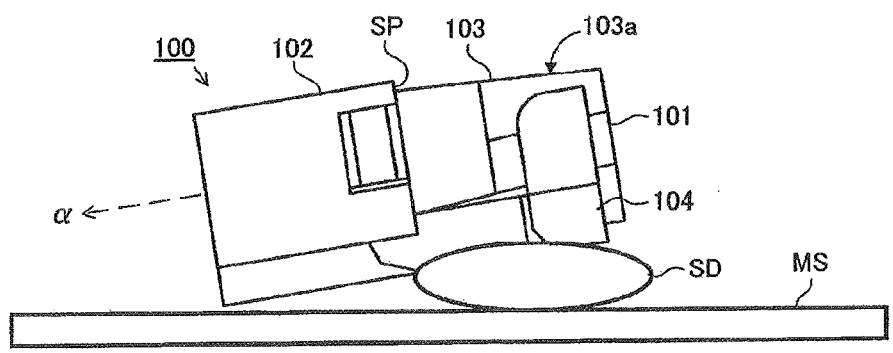

FIG. 16 is a perspective view when viewed from a different direction with respect to FIG. 14B.

Thereafter, the lead frames 21 and 22 protruding from the lower surface side of the package body 11 are bent, so that the terminal parts 21a and 22a of the lead frames 21 and 22 illustrated in FIG. 2 and FIGS. 10A to 10C are formed.

[Operation-Effect of Second Embodiment]

According to the manufacturing method of the light emitting device 50 in the second embodiment, the aforementioned operation-effect of [1]to [4] of the first embodiment can be obtained.

In the light emitting device 50, even though the package body 11 is long, since the two upper surface side flat parts 14a and 14b are respectively sucked by separate suction collets BC, it is possible to reliably apply the suction force of the suction collet BC to the package body 11, so that it is possible to reliably obtain the aforementioned operation-effect of [1].

As illustrated in FIG. 11A, it is necessary to set dimensions of the upper surface side flat parts 14a and 14b to be sufficiently larger than that of a suction port BCM of the suction collet BC.

Furthermore, in the light emitting device 50, even though the package body 11 is long, when the package body 11 has been surface-mounted on the wiring board MS, the two lower surface side flat parts 15a and 15b abut the wiring board MS and the package body 11 can be placed on the wiring board MS in a stable state, so that it is possible to reliably obtain the aforementioned operation-effect of [2].

Other Embodiments

The present invention is not limited to the aforementioned each embodiment, and may be embodied as follows, even in such a case, it is possible to obtain operation-effect equivalent to or beyond those of the aforementioned each embodiment.

[A] In the aforementioned each embodiment, one mold for forming the box-shaped block part 12 is employed as the movable mold 31 and the other mold for forming the inclined block part 13 is employed as the fixed mold 32.

However, the movable mold and the fixed mold may be reversed, that is, one mold for forming the box-shaped block part 12 may be employed as the fixed mold and the other mold for forming the inclined block part 13 may be employed as the movable mold.

[B] In the package body 11 of the light emitting device 50 in the second embodiment, the upper surface side flat parts 14a and 14b and the lower surface side flat parts 15a and 15b are respectively provided as a pair.

However, the number of the upper surface side flat parts and the number of the lower surface side flat parts may be respectively three or more according to the length of the package body 11.

In such a case, the plurality of flat parts are arranged to be line symmetric with respect to the center line L in the longitudinal direction of the package body 11, so that it is possible to obtain operation-effect equivalent to those of the second embodiment.

<Supplementary Note Based on Description of Embodiment>

The technical scope derivable from the aforementioned each embodiment and different embodiments are as follows.

[Supplementary note 1] A package body of a light emitting device manufactured by the manufacturing method of the light emitting device according to the first to sixth aspects.

[Supplementary note 2] An injection molding mold used in the manufacturing method of the light emitting device according to the first to sixth aspects.

The present invention is not limited to the aforementioned each aspect, the aforementioned each embodiment, and the aforementioned supplementary notes. The present invention also includes various modification examples in the range, which can be easily arrived by a person skilled in the art, without departing from the aforementioned each aspect, the aforementioned each embodiment, the aforementioned supplementary notes, and the scope of claims. The entire content of gazettes and the like in the present specification is incorporated by reference.

What is claimed is:

1. A manufacturing method of a side view type light emitting device, the side view type light emitting device including a package body including a synthetic resin material, the manufacturing method comprising:
    providing an injection-molding mold for injection-molding the package body, the injection-molding mold including:
        a first mold provided with a first convex part for forming an upper surface side flat part on an upper surface of the package body; and
        a second mold provided with a first concave part for forming the upper surface side flat part;
    fitting the first concave part around the first convex part so as to enter a liquid tight state with no gap provided between the first concave part and the first convex part; and
    injecting the synthetic resin material into each of the first and second molds so as to be filled therein, and hardening the synthetic resin material to form the package body in a state in which the first mold and the second mold are aligned with each other.

2. The manufacturing method of the light emitting device according to claim 1, wherein the first mold is further provided with a second convex part for forming the upper surface side flat part on the upper surface of the package body,
    wherein the second mold is further provided with a second concave part for forming the lower surface side flat part, and
    wherein the second concave part is fitted around the second convex part so as to enter a liquid tight state with no gap provided between the second concave part and the second convex part in a state in which the first mold and the second mold are aligned with each other.

3. The manufacturing method of the light emitting device according to claim 1, wherein the convex part and the concave part have a trapezoidal shape according to shape dimensions of the flat parts when viewed in a plan view, and
    wherein both sides of the convex part and the concave part have a tapered shape such that widths of both sides are narrowed toward a front end side of each of the convex part and the concave part.

4. The manufacturing method of the light emitting device according to claim 1, wherein a depth of the concave part is smaller than a height of the mold provided with the concave part.

5. The manufacturing method of the light emitting device according to claim 1, wherein the flat part is arranged to be formed at a center part in a longitudinal direction of the package body.

6. The manufacturing method of the light emitting device according to claim 1, wherein the flat part includes a plurality of parts, and the plurality of parts are arranged to be line symmetric with respect to a center line in a longitudinal direction of the package body.

7. The manufacturing method of the light emitting device according to claim 1, wherein an upper surface of the first convex part abuts a bottom surface of the first concave part.

8. The manufacturing method of the light emitting device according to claim 7, wherein a side surface of the first convex part abuts a side surface of the first concave part.

9. The manufacturing method of the light emitting device according to claim 1, wherein a side surface of the first convex part abuts a side surface of the first concave part.

10. The manufacturing method of the light emitting device according to claim 1, wherein the first mold includes a first flat surface provided adjacently on opposing sides of the first convex part, and the second mold includes a second flat surface provided adjacently on opposing sides of the first concave part, and
    wherein, in the fitting, the first flat surface of the first mold abuts the second flat surface of the second mold.

11. The manufacturing method of the light emitting device according to claim 10, wherein a height of the first convex part from the first flat surface is equal to a depth of the first concave part from the second flat surface.

12. The manufacturing method of the light emitting device according to claim 11, wherein a ratio of the depth of the first concave part to a thickness of the second mold is in a range from ⅛ to ¼.

13. The manufacturing method of the light emitting device according to claim 1, wherein a ratio of the depth of the first concave part to a thickness of the second mold is in a range from ¼ to ½.

14. A manufacturing method of a side view type light emitting device, the manufacturing method comprising:
    providing an injection-molding mold for injection-molding a package body of the side view type light emitting device, the injection-molding mold including:
        a first mold provided with at least one convex part for forming an upper surface side flat part on an upper surface of the package body; and
        a second mold provided with at least one concave part for forming the upper surface side flat part;
    fitting the at least one concave part around the at least one convex part so as to a liquid tight state such that the at least one concave part abuts the at least one convex part; and
    injecting the synthetic resin material into each of the first and second molds so as to be filled therein to form the package body in a state in which the first mold and the second mold are aligned with each other.

15. The manufacturing method of the light emitting device according to claim 14, wherein the package body includes a synthetic resin material.

16. The manufacturing method of the light emitting device according to claim 14, wherein an upper surface of the at least one convex part abuts a bottom surface of the at least one concave part.

17. The manufacturing method of the light emitting device according to claim 14, wherein a side surface of the at least one convex part abuts a side surface of the at least one concave part.

18. The manufacturing method of the light emitting device according to claim 14, wherein the first mold includes a first flat surface provided adjacently on opposing sides of the at least one convex part, and the second mold includes a second flat surface provided adjacently on opposing sides of the at least one concave part, and
    wherein, in the fitting, the first flat surface of the first mold abuts the second flat surface of the second mold.

19. The manufacturing method of the light emitting device according to claim 18, wherein a height of the at least one convex part from the first flat surface is equal to a depth of the at least one concave part from the second flat surface.

20. The manufacturing method of the light emitting device according to claim 18, wherein a ratio of the depth of the at least one concave part to a thickness of the second mold is in a range from ¼ to ½.

* * * * *